(12) United States Patent
Wikborg

(10) Patent No.: US 6,188,236 B1
(45) Date of Patent: Feb. 13, 2001

(54) ARRANGEMENT AND METHOD RELATING TO DIGITAL INFORMATION IN SUPERCONDUCTING CIRCUITS

(75) Inventor: Erland Wikborg, Danderyd (SE)

(73) Assignee: Telefonaktiebolaget LM Ericsson, Stockholm (SE)

( * ) Notice: Under 35 U.S.C. 154(b), the term of this patent shall be extended for 0 days.

(21) Appl. No.: 08/994,442

(22) Filed: Dec. 19, 1997

Related U.S. Application Data

(63) Continuation of application No. PCT/SE96/00809, filed on Jun. 20, 1996.

(30) Foreign Application Priority Data

Jun. 30, 1995 (SE) .................................................. 9502407

(51) Int. Cl.⁷ .................................................. H03K 19/95
(52) U.S. Cl. .................................................. 326/3; 326/6
(58) Field of Search .................................. 326/3, 4, 6, 99;
505/190, 858, 859, 861; 327/527, 528,
366, 367, 186; 331/107 S

(56) References Cited

U.S. PATENT DOCUMENTS

| | | | | |
|---|---|---|---|---|
| 3,953,749 | * | 4/1976 | Baechtold et al. | 327/186 |
| 4,117,354 | * | 9/1978 | Geewala | 326/5 |
| 5,114,912 | * | 5/1992 | Benz | 505/204 |
| 5,191,236 | * | 3/1993 | Ruby | 327/528 |
| 5,455,519 | * | 10/1995 | Ohori | 326/3 |
| 5,598,105 | * | 1/1997 | Kurosawa et al. | 326/6 |

FOREIGN PATENT DOCUMENTS 0506346    9/1992   (EP) .
2 156 620   10/1985  (GB) .

OTHER PUBLICATIONS

K.K. Likharev et al., "RSFQ Logic/Memory Family: A New Josephson–Junction Technology for Sub–Teraherz–Clock–Frequency Digital Systems," IEEE Trans. on Appl. Superc., vol. 1, No. 1 (Mar. 1991).

S.M. Schwarzbek et al., "SAIL High Temperature Superconductor Digital LOGIC: Improvements and Analyses," IEEE Trans. on Appl. Superc., vol. 3, No. 1 (Mar. 1993).

A.K. Jaine et al., "Mutual Phase–Locking in Josephson Junction Arrays," Phys. Report, 109, pp. 309–426 (1984).

K. Nakajima et al., "Logic Design of Josephson Network," J. of Appl. Physics, vol. 47, No. 4(Apr. 1976).

T.R. Gheewala, "Josephson–Logic Devices and Circuits," IEEE Trans. on Electron Devices, vol. ED–27, No. 10 (Oct. 1980).

* cited by examiner

*Primary Examiner*—Jon Santamauro
*Assistant Examiner*—Don Phu Le
(74) *Attorney, Agent, or Firm*—Burns, Doane, Swecker & Mathis, L.L.P.

(57) ABSTRACT

A logic circuit arrangement includes signal input and signal output devices and a number of SFQ circuits having Josephson junctions in which carrier devices are used for carrying digital information. The SFQ circuits are sampled at the input/output for producing DC voltages and a train having at least two single flux quanta is used as a carrier device for information and phase locking between at least two Josephson junctions is used to provide at least two different dynamic states of which at least one provides an output signal.

32 Claims, 2 Drawing Sheets

ARRANGEMENT AND METHOD RELATING TO DIGITAL INFORMATION IN SUPERCONDUCTING CIRCUITS

This application is a continuation of International Application No. PCT/SE96/00809, filed Jun. 20, 1996, which designates the United States.

BACKGROUND

The present invention relates to a logic circuit arrangement which comprises signal input means and signal output means and flux quanta circuits comprising Josephson junctions. The flux quanta are used for carrying digital information.

The invention also relates to an arrangement for processing digital information comprising a number of logic elements, for example one or more of any combination of AND elements, OR elements and NOT elements each of which comprises input and output means and wherein single flux quanta are used as carriers of digital information.

Still further the invention relates to a method for stabilizing a logic circuit arrangement comprising a number of logic elements using flux quanta as information carriers.

Most common today are semiconductor-transistor-based integrated circuits. In semi-conductor logic, digital information is represented as voltage levels wherein the voltage level differences are determined by the electronic band gap. However, circuits based on semiconductor logic have a limited frequency of operation, i.e. it is not as high as could be desired for a number of applications and moreover the power dissipation is not as low as sometimes wanted or needed. This means that for a number of applications these values are not satisfactory.

Therefore a considerable amount of research within superconducting electronics has been done and among others a Rapid Single Flux Quantum (RSFQ) circuit family has been developed. This is based on superconductor integrated circuits and use Josephson junctions. Josephson junction technologies as such have been found advantageous for digital applications among others since the intrinsic switching speed of Josephson junctions is very high, such as around a few picoseconds. Moreover the power dissipation is low and the fabrication technologies are simple as compared to semiconductor transistors for corresponding devices.

In "RSFQ Logic/Memory Family: A New Josephson-Junction Technology for Sub-Teraherz-Clock-Frequency Digital Systems" by K. K. Likharev and V. K. Semenov in IEEE Transactions on Applied Superconductivity, Vol 1, No 1, March 1991 a rapid single flux quantum (RSFQ) circuit family is presented where the logic is based on processing of single flux quanta wherein each digital information bit is represented by a single flux quantum or a fluxon. Therefore it is, particularly at higher frequencies, easily subjected to bit errors and SFQ-to-DC converters are required as input/output interfaces of an RSFQ chip. These converters serve the purpose of converting digital voltage levels to SFQ pulses and vice versa. The circuit is fully superconducting and the RSFQ logic requires a better magnetic field shielding the larger the circuit is in order to provide shielding from external magnetic fields.

In "SAIL High Temperature Superconductor Digital LOGIC: Improvements and Analyses" by S. M. Schwarzbek et al in IEEE Transactions on Applied Superconductivity, Vol. 3 No 1, March 1993, another SQUID based scheme, a so called Series Array Interferometer Logic, (SAIL) is provided. This logic has similarities with CMOS but it suffers from not being fast enough to compete with the fastest (at room temperature) semiconductor logic circuits.

Moreover flux flow transistor based logic (SFFT) is attractive in so far as it is dual to Field Effect Transistor (FET) logic, but it is inherently slow compared with the RSFQ logic and moreover the power dissipation is several orders of magnitude higher.

Moreover single flux quanta (SFQ) based circuits are known wherein the SFQs are used as digital carriers. However, then resistors are used for the interconnection of active elements. The circuit parameters of these devices have very small margins.

The above mentioned RSFQ logic, although being comparatively fast and having a comparatively low power dissipation, still leaves a lot to desire among others as far as speed and power dissipation is concerned. Moreover, elements based on this logic require additional equipment in order to interface with for example semiconductor circuits since digital voltage levels have to be converted to SFQ pulses and vice versa.

SUMMARY

Therefore a logic circuit arrangement is needed through which a still higher frequency of operation is enabled. Further still a logic circuit arrangement is needed wherein the power dissipation can be still further reduced.

Moreover a logic circuit arrangement is needed which can be easily interfaced with for example logic semiconductor circuits, particularly without requiring any additional components.

Generally a logical circuit arrangement is needed which is fast, easy and cheap to fabricate and which can easily be combined with other circuits or circuit arrangements of the same or different kinds.

Therefore a logic circuit arrangement as initially referred to is provided which comprises a number of Josephson junctions which are so arranged that mutual phase locking between the Josephson junctions is used for providing an output signal wherein a train of single flux quanta are used as digital information carriers. The logic digital information is represented as voltage levels (like in semiconductor logic) which facilitates interfacing with semiconductor circuits. The voltage level difference is here determined by the superconducting pairing energy which is given by the $I_c R_n$-product of the employed Josephson junctions which are shunted or unlatching, i.e. overdamped unlike in semiconductor logic wherein the voltage level differences are determined by the electronic band gap. This makes the arrangements according to the present invention easy to interface with semiconductor circuits. Particularly, in order to provide a still faster operation of the logic circuit arrangement, the Josephson junctions may be directly connected, i.e. without requiring any converting arrangements etc.

Particularly voltage supply means may be provided (connected), which advantageously are superconducting, to the circuit arrangement or particularly to every logic element of the circuit arrangement in order to provide a standard voltage output. According to various advantageous embodiments, the logic circuit element may comprise an AND element, an OR element and NOT element respectively or any combination thereof. Advantageously superconducting signal input/output means are used which even more particularly may be high temperature superconducting. Further advantageous embodiment are given by the appended subclaims.

Moreover an arrangement for processing of digital information as initially referred to is provided. The input/output means comprises superconductors, in a most advantageous embodiment high temperature superconductors, and to each logic element a voltage supplying means is connected for supplying every circuit or logic element with substantially the same voltage and wherein each logic element or circuit comprises a number of Josephson junctions which are so arranged that via phase locking of flux quanta between two or more Josephson junctions, the output signals are provided, the type of the signal being given by the particular Josephson junctions involved in the phase locking.

The Josephson junctions are shunted and a train of fluxons (at least two) acts as digital carrier. The effect of mutual phase locking between Josephson junctions is used, this is further described in A. K. Jaine, K. K. Likharev, J. E. Lukens et al, in "Mutual Phase-Locking in Josephson Junction Arrays", Phys. Report., 109, 1984, pp 309–426 which is incorporated herein by reference. Mutual phase locking intrinsically requires more than one SFQ pulse and therefore a train of fluxons is used, the minimum being two fluxons. Physically each Josephson junction can be seen as a frequency oscillator and when two or more of said oscillators interact, this leads to a mutually phase locked state. Digital information is presented as one of a number of different dynamic states (particularly two) characteristic for the given kind of information. In order to use the phase locking more than one fluxon is required as discussed above. Phase locking as such represents a complicated dynamic state and in order to provide a standard voltage output, advantageously (superconducting) voltage supply means are used. According to the present invention, different dynamical states are thus used to present different kinds of digital information.

Advantageously the invention relates to a logical circuit arrangement comprising a high number of logical elements in any desired combination and particularly it relates to large scale (LSI) or very large scale integrated circuits (VLSI).

Actually the invention provides for an entirely new superconducting logic family through which substantially any logic element can be built or provided as well as any combination of logical elements.

It is an advantage of the invention that the arrangements are easy to interface with among others semiconductor circuits since logic, digital information in both cases is represented as voltage levels.

It is also an advantage of the present invention that it enables a high maximum operation frequency which for example may be about 200 GHz or even more.

Another advantage of the invention is that the power dissipation per logic element is very low such as for example of the order of magnitude of about $10^{-6}$J.

Another advantage is that the logic is less sensitive to external magnetic fields than for example RSFQ circuit. Thus the logic circuit arrangements according to the invention are simpler and require less complicated magnetic shielding than hitherto known circuit arrangements which is particularly advantageous for large circuits or even very large circuits (LSI and VLSI respectively).

BRIEF DESCRIPTION OF THE DRAWINGS

The invention will in the following be further described in a nonlimiting way under reference to the accompanying drawings in which.

DETAILED DESCRIPTION

The logic family as suggested by the present invention comprises logical circuit arrangements which may comprise different logic elements such as so called NOT elements, OR elements and AND elements as well as any combination thereof. Such logical elements or logical circuit arrangements comprise single flux quanta hereinafter referred to as SFQ circuits. These are sampled t the input/output in order to produce DC voltages. Generally these logical circuit arrangements or logical elements have the advantages (at least) as far as speed and low power dissipation of RSFQ circuits as referred to above are concerned and moreover they have the advantages of Josephson transmission lines, at least in the cases when input/output means comprises superconductors as far as SFQ energy amplification and noise discrimination is concerned. For comparatively low frequency applications, alternatively to Josephson transmission lines superconducting microstrip lines can be used as will be discussed below.

The sampling of a sufficiently high number of SFQ pulses (the number will be further discussed below) makes the arrangements robust, i.e. they have a low bit error rate (BER), as compared to that of semiconductor voltage stage logic and they are also easily interfaceable with semiconductor circuits as discussed above. The speed of the logic is defined by the minimum number of fluxons needed, for example two or three (n=2–3) to be sampled by an element to attain (or switch to) a stable voltage level. Furthermore the critical current of the Josephson junctions can be reduced since the information is stored in form of a voltage. Sometimes there is a contradiction between a low bit error rate (BER) and speed but since for the superconducting junctions, or in particularly advantageous embodiments high temperature superconducting Josephson junctions, the $I_cR_n$ value is high, it does not matter that the speed is somewhat lowered for the provision of a still lower BER. The $I_cR_n$ value or product is the critical current times the normal resistivity which means the resistivity under normal conditions. The operational frequency of a logic element or a logic circuit arrangement may be about $I_cR_n\Phi_0^{-1}/n$ or approximately 200 GHz or even more, particularly for HTS based circuits. This is for example much higher than that of the SAIL logic referred to above and the fact that advantageously direct connections are used, which means that no transformers are used between Josephson junctions in the SFQ logic elements, also contributes in providing high speed. Thus a voltage state logic is provided which is based on sampling of single flux quanta or fluxons which are phase locked between the signal input and output means of the SFQ circuits.

Figure 1:
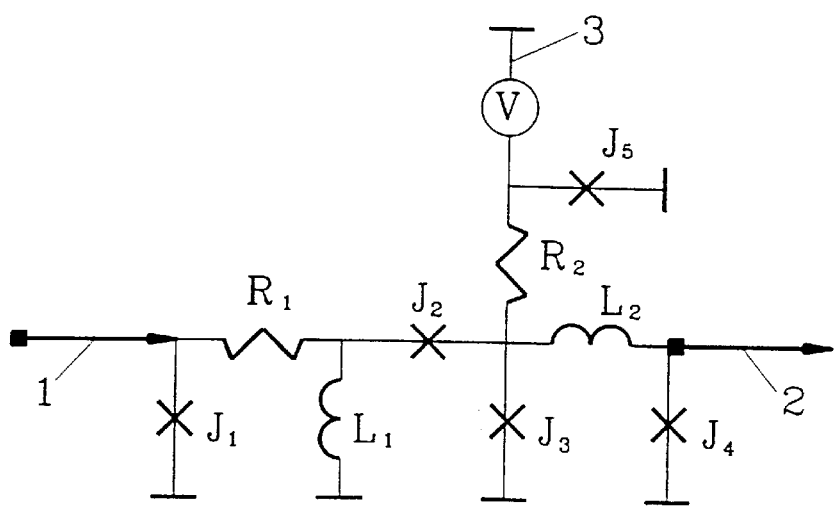
FIG. 1 schematically illustrates a logical NOT element.

FIG. 1 illustrates an equivalent circuit of a logical circuit arrangement according to the invention which comprises a NOT element. The NOT element comprises signal input means 1 and signal output means 2. Advantageously the input and output means 1,2 respectively comprise Josephson transmission lines although for relatively low frequencies they may e.g. be exchanged through superconducting microstrip lines. In a most advantageous embodiment the Josephson transmission lines comprise a high temperature superconducting material although this is not necessary. $J_1$, $J_4$ indicate Josephson junctions connected to the signal input and output means 1,2 respectively. A separate superconducting voltage supply means 3 supplies a standard voltage to the Josephson junction $J_5$ and causes it to generate the corresponding Josephson frequency which is an essential feature. The voltage supply means (connected to a voltage source) comprises e.g. a conventional superconducting wiring with one Josephson junction e.g. at the end thereof. The fact that no complicated design is actually needed is a further advantage of the present invention. An active circuit means forming an interferometer comprises a.o. the Josephson junctions $J_2,J_3$ and the inductor $L_1$ which prevents penetrations of the fluxons from the signal output voltage means 2 to the signal input voltage means. Advantageously all the Josephson junctions as indicated in the figure are biased with DC currents (in a manner known per se) which however are not illustrated in the figure. Also the inductor $L_1$ is biased with a DC current. If the needed frequencies are particularly high or the highest available frequencies, the Josephson junctions $J_1$, $J_4$ can be seen as a continuation of the input/output means or particularly the Josephson transmission lines (JTL) if such are used which in practice means that they simply can be seen as parts of the Josephson transmission lines 1,2.

However, generally the NOT element according to the invention works as follows: The bias current $I_3$ (which means the bias current for the Josephson junction $J_3$; generally the same numbers are used for a Josephson junction and its biasing current) is large enough to generate a voltage at the output of the logic circuit arrangement, here particularly the NOT element, in the absence of any input voltage which corresponds to a logic "0". The voltage supply means 3 supplies a standard voltage to the Josephson junction $J_5$ and causes it to generate the corresponding Josephson frequency as mentioned above. Mutual phase locking (as described in the reference referred to above "Mutual Phase Locking in Josephson Junction Arrays") between oscillations in the Josephson junction $J_5$ and the oscillations in the output junctions $J_2$ and $J_3$ is provided by the resistor $R_2$ connected between the voltage supplying means 3 and the output means 2. This is sampled or read as the standard voltage corresponding to logic "1" on the output of the NOT element. The inductor $L_1$ prevents a penetration of the fluxons from the output to the input as also discussed above.

An input voltage (logic "1") through the link $R_1$-$L_1$ produces a phase shift in the interferometer formed by a $J_2$, $J_3$ and $L_1$ and switches it to the zero voltage state giving a logic zero "0" at the output. The fast switching is provided by the SFQ interaction through the inductor $L_1$ and the resistor $R_1$.

For illustrative purposes some examples on values will be given (for one particular embodiment) for the resistors, inductors etc. The resistor $R_2$ may for example have a resistance of 10 $\Omega$ and the inductors $L_1$ and $L_2$ may have inductances of 3.9 pH. As referred to above all Josephson junctions are biased with DC currents which for example may take the following values $I_1$=0.2 mA, $I_3$=0.462 mA, $I_4$=0.2 mA and the inductance of the inductor $L_1$ may be biased with the current $I_L$=0.177 mA. These examples are of course merely given as examples and should in no way be interpreted as limitative on the scope of the present invention.

Figure 2:
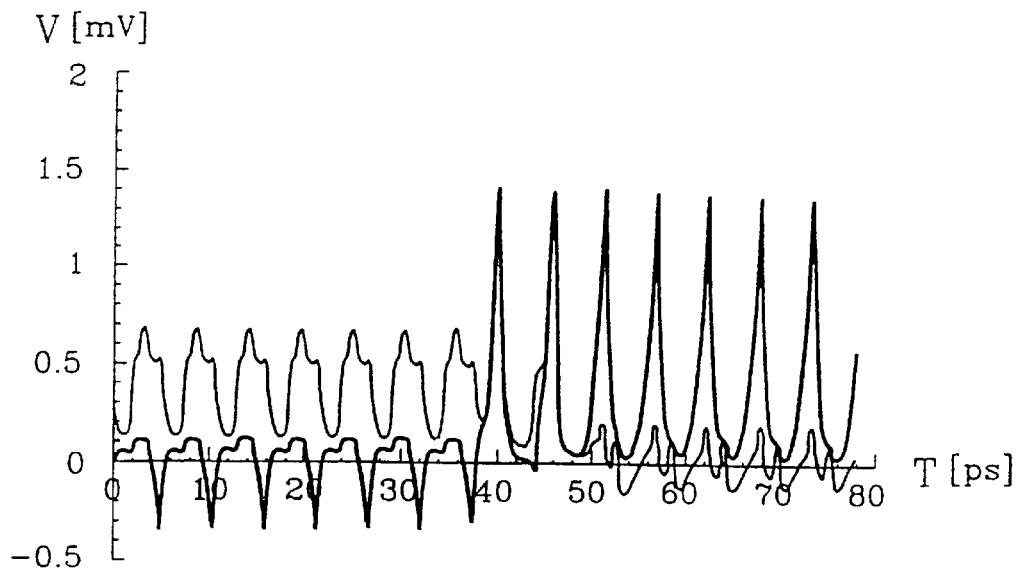
FIG. 2 illustrates a diagram on simulation results of a N 0 T element illustrating input and output voltage versus switching time.
Figure 3A:
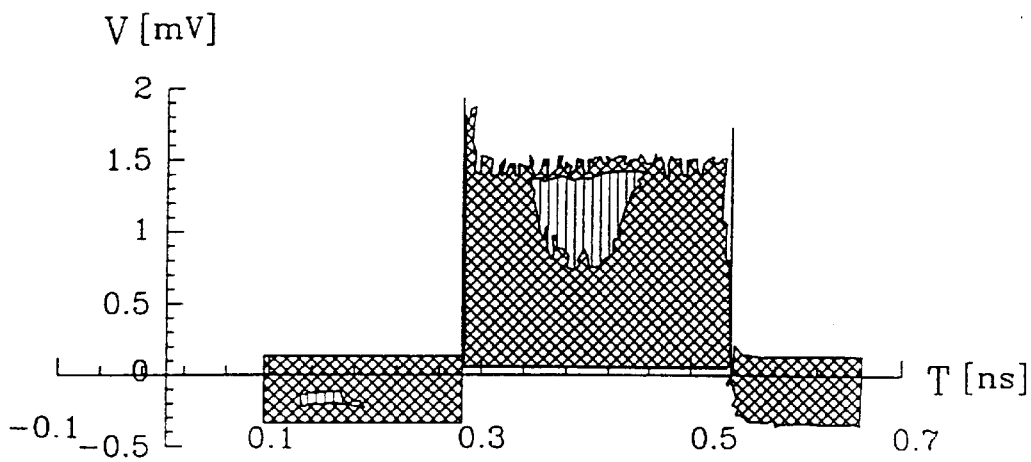
FIG. 3a illustrates simulation results of input voltage versus time.
Figure 3B:
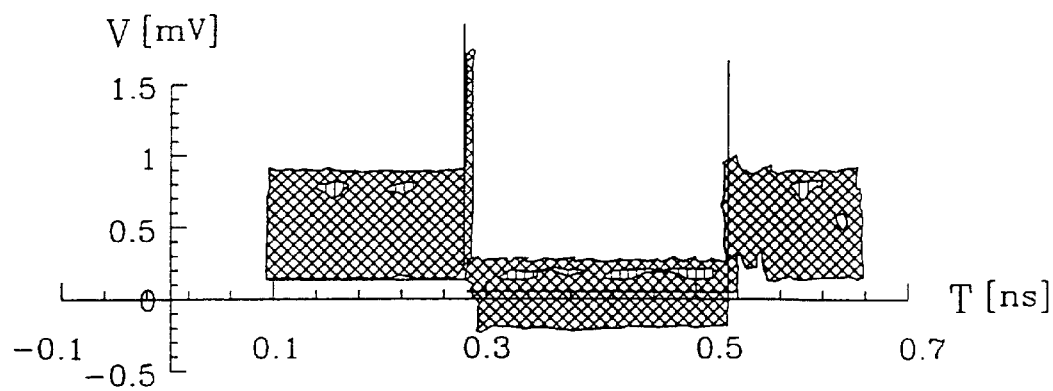
FIG. 3b illustrates the output voltage corresponding to the input voltage of FIG. 3a and FIG. 4 schematically illustrates an equivalent circuit of an OR/AND element.

FIGS. 2,3a and 3b show simulation results of a NOT element according to the invention. The Josephson junction parameters that are used are the following: $V_C$=1 mV, $R_n$=4 $\Omega$, $I_c$=0.25 mA, $\beta_c$=0 for all the junctions. The digital voltage unit is 0.375 mV. FIG. 2 indicates that in fact only two fluxons are needed for switching and that the time delay is about 10 ps corresponding to approximately 100 GHz. In case high temperature superconducting materials are used for the Josephson junctions $V_c$ could be increased to about 10 mV which might reduce the time scale more or less by a factor 10 which means that the operational frequency could be increased to 1 THz. In FIG. 2 a dashed line indicate output whereas a continuous line indicate input voltage.

Instantaneous voltages of the Josephson junction on input/output are shown. Each pass means a fluxon through the junction. The average voltage can be measured and is used for storing digital information. A stream of single flux quanta produces an average voltage across the Josephson junctions.

Figure 4:
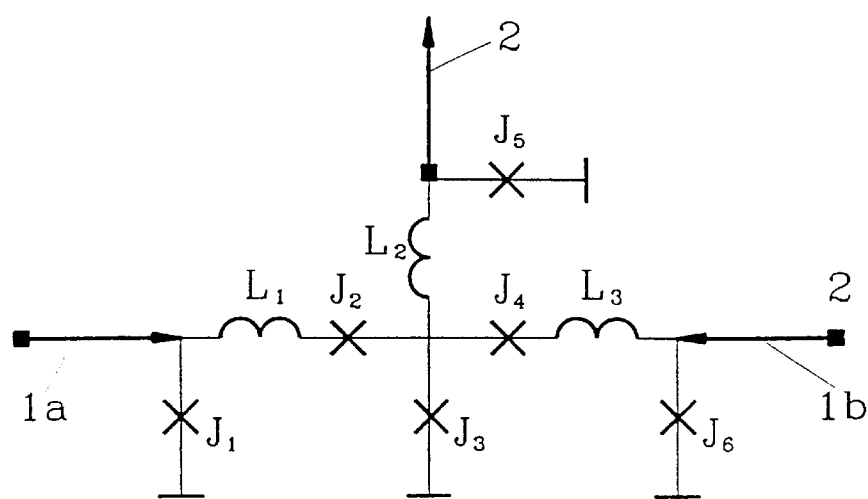

FIG. 4 illustrates an equivalent circuit for a combined OR and AND element. Of course these elements are provided separately. In this case $\beta_c$=0 wherein $$\beta_c = \frac{2e}{\hbar} I_c R_n^2 C$$

$\beta_c$ being the McCumber parameter, $I_c$ the critical current of the junction, $R_n$ the normal resistance, C the capacitance, e the charge of the electron and h the Plank constant and $V_c$=1 mV (=$I_c R_n$). This circuit operates in a way which is quite similar to that of the RSFQ circuit as described in the reference by Likharev as discussed above. One important difference is that a loss (or gain) of one single fluxon in this case is not important since the minimal duration for a voltage pulse is two or more fluxons. Depending on the values of the critical currents and the bias currents (which are not indicated in the figure) of the junctions, the herein illustrated circuit can operate both as an OR element and as an AND element. The circuit comprises first signal input means 1a and second signal input means 1b. Furthermore it comprises signal output means 2. As discussed above under reference to the NOT element, these input and output means respectively may comprise a superconducting material or particularly a high temperature superconducting material. Advantageously they comprise Josephson transmission lines JTL. The logic circuit arrangement operates as follows:

If there is a voltage ("1") on but one of the input means 1a or 1b and the corresponding train of fluxons can switch the Josephson junction $J_3$ thus giving a voltage on the output, it constitutes an OR element. If on the other hand, a voltage ("1") is needed from both inputs means 1a,1b in order to switch the Josephson junction $J_3$, it constitutes an AND element.

In FIG. 4 no voltage supply means corresponding to the ones of FIG. 1 are indicated. These are not necessary, but on the other hand it can be useful to supply a voltage via voltage supply means also in this case, among others in order to increase the stability of the elements and the above discussion relating to the voltage supply means (3) is relevant also here. Josephson junctions $J_1,J_6$ are connected to the first and the second input means whereas the Josephson junction $J_5$ is connected to the output means. If the arrangement operates as an OR element, there is a voltage input on the first 1a or the second input 1b, and the corresponding Josephson junction provides a phase locking to Josephson junction $J_5$. If it operates as an AND element and there are input signals both on the first and the second input means 1a, 1b, Josephson junctions $J_1,j_6$ and $J_3$ provide a phase locking to $J_5$.

With the above mentioned elements (AND, OR, NOT) practically every logic element circuit can be built.

According to the invention a logical circuit arrangement or an arrangement for processing digital information may comprise a large circuit comprising various combinations of the above mentioned elements. Then advantageously all parts the of the circuit operate on one and the same frequency and this is particularly provided through supplying every circuit or logic element with a standard supply voltage as discussed above. Thus, using the logical family of the present invention considerably facilitates the fabrication of large circuits.

With the use of voltage supply means (superconducting) and via using the phase locking, is possible to stabilize such large circuits.

Also in a number of other aspects the invention can be varied without departing from the scope thereof.

What is claimed is:

1. A logic circuit arrangement comprising signal input means, signal output means, and a number of single flux quantum circuits comprising Josephson junctions, wherein the single flux quantum circuits are sampled at at least one of the signal input and output means for producing DC voltages, digital information is carried by a train comprising at least two single flux quanta, and at least two different dynamic states are available via phase locking between at least two of the Josephson junctions, of which dynamic states at least one provides an output signal wherein at least one Josephson junction is connected to each of the signal input and output means, between which an active circuit comprising a number of Josephson junctions is arranged.

2. The arrangement of claim 1, wherein the Josephson junctions of the single flux quantum circuits are so arranged that at least two dynamic states are available and an output signal is determined by the phase locking between the Josephson junctions of the different single flux quantum circuits.

3. The arrangement of claim 1, wherein input digital information is stored as a voltage.

4. The arrangement of claim 1, wherein at least some of the Josephson junctions are directly connected.

5. The arrangement of claim 1, further comprising voltage supplying means connected to the active circuit, wherein a further Josephson junction is connected to the voltage supplying means.

6. The arrangement of claim 1, wherein at least one of the signal input and signal output means comprises a superconductor.

7. The arrangement of claim 6, wherein the superconductor is a High Temperature Superconductor (HAS).

8. The arrangement of claim 6, wherein at least one of the signal input and signal output means comprises a Josephson Transmission Line (JCL).

9. The arrangement of claim 5, wherein the voltage supplying means comprises conventional superconducting wiring.

10. The arrangement of claim 6, wherein at least one of the signal input and signal output means and the voltage supplying means comprises a microstrip line.

11. The arrangement of claim 1, wherein the arrangement comprises at least one OR element.

12. The arrangement of claim 1, wherein the arrangement comprises an AND element.

13. The arrangement of claim 1, wherein the arrangement comprises an element which can be used as an AND element or an OR element, and requirements for producing an output signal determine whether the arrangement operates as an AND element or an OR element.

14. The arrangement of claim 1, wherein the arrangement comprises at least first and second signal input means.

15. The arrangement of claim 14, wherein to provide an output voltage over the output means, a voltage, input on only one of the signal input means which is represented by a train of single flux quanta which are able to switch a Josephson junction of the active circuit, is required to provide an output voltage signal, and the arrangement operates as an OR element.

16. The arrangement of claim 14, wherein to provide an output signal, input signals on both signal input means are required and the arrangement operates as an AND element.

17. The arrangement of claim 11, further comprising at least one voltage supplying means connected to a further Josephson junction and to at least a number of logic elements comprised by the circuit.

18. The arrangement of claim 17, wherein a voltage applied via at least one of a first input means and a second input locks a quantum mechanical phase difference across the further Josephson junction of the output means.

19. The arrangement of claim 1, wherein a Josephson junction is connected to the signal input and output means, between which an active circuit means comprising at least one Josephson junction is arranged and to which a voltage supplying means is connected over a resistor and to which at least one Josephson junction is connected and the arrangement comprises a NOT element.

20. The arrangement of claim 19, wherein the active circuit means comprises a highly non-linear circuit means, and in an absence of any input signal representing a first dynamical state, an output signal is provided, whereas through the highly non-linear circuit means all single flux quanta are eliminated when an input voltage signal is present, thus representing a second dynamical state.

21. The arrangement of claim 20, wherein the active circuit means comprises an interferometer comprising two Josephson junctions and an inductor.

22. The arrangement of claim 21, wherein via the resistor between the voltage supplying means and the active circuit means and a set standard voltage on the signal output means, mutual phase locking between the Josephson junction connected to the voltage supplying means and the Josephson junctions of the active circuit means is provided.

23. The arrangement of claim 22, wherein the active circuit means comprises an inductor for preventing penetration of single flux quanta from the signal output means to the signal input means.

24. The arrangement of claim 22, wherein an input voltage through a first resistor and an inductor of the interferometer produces a phase shift of the interferometer and switches it to a zero voltage state giving a logical zero output signal.

25. The arrangement of claim 1, wherein at least one of the Josephson junctions is shunted.

26. An arrangement for processing digital information, comprising a number of logic elements, each comprising input and output means, wherein the input and output means comprise superconductors, and a superconducting voltage supplying means is connected to each logic element for supplying the respective logic element with substantially the same voltage as is supplied to other logic elements, and each logic element further comprises a number of Josephson junctions arranged such that phase locking of single flux quanta between the Josephson junctions determines output signals of the logic elements.

27. The arrangement of claim 26, wherein phase locking between different Josephson junctions provides different dynamic states.

28. The arrangement of claim 26, wherein digital information is carried by a train of fluxons.

29. The arrangement of claim 26, wherein digital information is represented as voltage levels, and a difference between voltage levels is given by an $I_c R_n$-product of the involved Josephson junctions.

30. A method for stabilizing a digital logic circuit having a number of logic elements each including a number of Josephson junctions, comprising the steps of connecting each logic element to superconducting voltage supply means, supplying to each logic element substantially the same voltage, and using phase locking between Josephson junctions of each respective element to provide an output signal of the respective logic element.

31. The method of claim 30, wherein digital information is represented as voltage levels and an input voltage is converted into a train of single flux quanta comprising at least two single flux quanta by a Josephson junction.

32. A method according to claim 30, wherein the digital logic circuit includes signal input means and signal output means, and further comprising the step of connecting at least one Josephson junction to each of the signal input means and signal output means, between which an active circuit comprising a number of Josephson junctions is arranged.

* * * * *